(12) United States Patent
Cabanillas et al.

(10) Patent No.: US 9,467,106 B2
(45) Date of Patent: Oct. 11, 2016

(54) WIDEBAND BIAS CIRCUITS AND METHODS

(71) Applicant: QUALCOMM Incorporated, San Diego, CA (US)

(72) Inventors: Jose Cabanillas, San Diego, CA (US); Calogero Davide Presti, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/931,562

(22) Filed: Nov. 3, 2015

(65) Prior Publication Data

US 2016/0056779 A1 Feb. 25, 2016

Related U.S. Application Data

(63) Continuation of application No. 14/172,150, filed on Feb. 4, 2014, now Pat. No. 9,219,447.

(60) Provisional application No. 61/876,347, filed on Sep. 11, 2013.

(51) Int. Cl.
*H03F 3/24* (2006.01)
*H03F 1/02* (2006.01)
(Continued)

(52) U.S. Cl.
CPC ............. *H03F 3/245* (2013.01); *H03F 1/0211* (2013.01); *H03F 1/0222* (2013.01);
(Continued)

(58) Field of Classification Search
CPC .. H03F 2200/451; H03F 3/19; H03F 1/0205; H03F 3/193; H03F 3/21; H03F 3/245; H03F 1/223; H03F 1/0211; H03F 1/0261; H03F 1/3205; H03F 1/565; H03F 2200/411; H03F 3/195; H03F 3/213; H03F 3/217
USPC .......................................... 330/311, 277, 285
See application file for complete search history.

(56) References Cited

U.S. PATENT DOCUMENTS 4,394,590 A 7/1983 Honda
6,137,367 A * 10/2000 Ezzedine ................ H03F 1/223
330/311

(Continued)

FOREIGN PATENT DOCUMENTS

WO 2009060095 A1 5/2009

OTHER PUBLICATIONS

International Search Report and Written Opinion—PCT/US2014/055091—ISA/EPO—Nov. 24, 2014.
(Continued)

*Primary Examiner* — Khanh V Nguyen
(74) *Attorney, Agent, or Firm* — Haynes and Boone, LLP

(57) ABSTRACT

The present disclosure includes circuits and methods for wideband biasing. In one embodiment, an amplifier includes a cascode transistor between an input and an output of the amplifier. The cascode transistor receives a bias from a bias circuit comprising a resistor between the power supply and a first node, a resistor between the first node and a reference voltage, and a capacitor between the power supply and the first node. The power supply may be a modulated power supply, which is coupled through the bias circuit to a capacitance at the control terminal of the cascode transistor. An inductor is configured between a terminal of the cascode transistor and the power supply. The inductor may isolate the output from the modulated supply signal.

13 Claims, 7 Drawing Sheets

(51) Int. Cl.
*H03F 3/193* (2006.01)
*H03F 1/22* (2006.01)
*H03F 1/48* (2006.01)

(52) U.S. Cl.
CPC .......... *H03F 1/0266* (2013.01); *H03F 1/223* (2013.01); *H03F 1/483* (2013.01); *H03F 3/193* (2013.01); *H03F 1/0244* (2013.01); *H03F 2200/18* (2013.01); *H03F 2200/21* (2013.01); *H03F 2200/36* (2013.01); *H03F 2201/3215* (2013.01)

(56) References Cited

U.S. PATENT DOCUMENTS

| | | | |
|---|---|---|---|
| 7,355,375 B2 | 4/2008 | Xi | |
| 7,378,912 B2 | 5/2008 | Tanahashi et al. | |
| 8,102,214 B2* | 1/2012 | Park | H03F 1/223 330/311 |
| 8,120,414 B2 | 2/2012 | Albean | |
| 8,228,125 B2* | 7/2012 | Heijden | H03F 1/223 330/311 |
| 8,427,241 B2* | 4/2013 | Ezzeddine | H03F 1/0205 330/311 |
| 8,493,154 B1 | 7/2013 | Camargo et al. | |
| 8,847,689 B2 | 9/2014 | Zhao et al. | |
| 2011/0181364 A1 | 7/2011 | Ahadian et al. | |
| 2013/0116017 A1 | 5/2013 | Zhang et al. | |
| 2015/0070095 A1 | 3/2015 | Cabanillas et al. | |

OTHER PUBLICATIONS

Kim J., et al., "Envelope-Tracking Two-Stage Power Amplifier With Dual-Mode Supply Modulator for LTE Applications", IEEE Transactions on Microwave Theory and Techniques, IEEE Service Center, Piscataway, NJ, US, vol. 61, No. 1, Jan. 17, 2013 (Jan. 17, 2013), pp. 543-552, XP011488011, ISSN: 0018-9480, DOI: 10.1109/TMTT.2012.2225532 p. 543, right-hand column, line 3-p. 548, right-hand column, line 7; figures7,12.

* cited by examiner

… (1) …

WIDEBAND BIAS CIRCUITS AND METHODS

CROSS REFERENCE TO RELATED APPLICATIONS

This Application is a continuation of and claims priority to U.S. patent application Ser. No. 14/172,150, filed Feb. 4, 2014, which claims priority to U.S. Provisional Application No. 61/876,347 filed Sep. 11, 2013. The content of U.S. patent application Ser. No. 14/172,150 and U.S. Provisional Application No. 61/876,347 are incorporated herein by reference in their entirety for all purposes.

BACKGROUND

The present disclosure relates to electronic circuits and methods, and in particular, to wideband bias circuits and methods.

CMOS transistors are occasionally stacked in order to split the voltage swing across multiple devices for reliability purposes. FIG. 1 illustrates a typical amplifier stage. An input signal is applied to the gate of a bottom MOS device 101 (e.g., in common source (CS) configuration). The top cascode device 102 (in common gate (CG) configuration) is commonly biased using a resistive element (e.g., resistor ladder including resistors 103 and 104) between the supply and ground. The cascode device has a gate capacitance 105 that holds a bias voltage. Traditional approaches for biasing nodes in a circuit from a supply voltage using resistive element are satisfactory if the supply voltage maintains a constant (or nearly constant) value. However, in applications where the supply voltage changes, the resistances and capacitances may impair the operation of the circuit.

SUMMARY

The present disclosure includes circuits and methods for wideband bias circuits. In one example embodiment, an amplifiers includes a cascode transistor between an input and an output of the amplifier. The cascode transistor receives a bias from a bias circuit comprising a resistor between the power supply and a first node, a resistor between the first node and a reference voltage (e.g., ground), and a capacitor between the power supply and the first node. The power supply may be a modulated power supply, which is coupled through the bias circuit to a capacitance at the control terminal of the cascode transistor. An inductor is configured between a terminal of the cascode transistor and the power supply. The inductor may isolate the output from the modulated power supply signal.

In one embodiment, the present disclosure includes an amplifier circuit comprising a first transistor having a control terminal, a first terminal, and a second terminal, the control terminal configured to receive an input signal, a cascode transistor having a control terminal, a first terminal, and a second terminal, wherein the second terminal of the cascode transistor is coupled to the first terminal of the first transistor, an inductor having a first terminal coupled to the first terminal of the cascode transistor and a second terminal coupled to a modulated power supply terminal, a first resistor having a first terminal coupled to the modulated power supply terminal and a second terminal coupled to a first node, a second resistor having a first terminal coupled to the first node and a second terminal coupled to a reference voltage, and a capacitor having a first terminal coupled to the modulated power supply terminal and a second terminal coupled to the first node, wherein the first node is coupled to the control terminal of the cascode transistor, and wherein the modulated power supply terminal produces a time varying power supply signal corresponding to the input signal.

In one embodiment, the control terminal of the cascode transistor comprises a capacitance.

In one embodiment, the first resistor, the second resistor, and the capacitor are configured to couple the time varying power supply signal to the control terminal of the cascode device across a first range of frequencies greater than a second range of frequencies of the input signal.

In one embodiment, a first product of a resistance of the first resistor and a capacitance of the capacitor is approximately equal to a second product of a resistance of the second resistor and a capacitance at the control terminal of the cascode transistor.

In one embodiment, the cascode transistor is a first cascode transistor, the amplifier circuit further comprising a second cascode transistor having a control terminal, a first terminal, and a second terminal, wherein the first terminal of the second cascode transistor is coupled to the second terminal of the first cascode transistor, and wherein the second terminal of the second cascode transistor is coupled to the first terminal of the first transistor, a third resistor having a first terminal coupled to the modulated power supply terminal and a second terminal coupled to a second node, a fourth resistor having a first terminal coupled to the second node and a second terminal coupled to the reference voltage, and a second capacitor having a first terminal coupled to the modulated power supply terminal and a second terminal coupled to the second node, wherein the second node is coupled to the control terminal of the second cascode transistor.

In one embodiment, the circuit further comprises a third resistor coupled between the first node and the control terminal of the cascode transistor.

In one embodiment, the inductor isolates the first terminal of the cascode transistor from the time varying power supply signal on the second terminal of the inductor.

In one embodiment, a bandwidth of the input signal is less than a bandwidth of the time varying power supply signal.

In another embodiment, the present disclosure includes a method of amplifying a signal comprising receiving an input signal on a control terminal of a first transistor, the first transistor having a control terminal, a first terminal, and a second terminal, coupling the input signal through the first transistor and a cascode transistor to produce an output signal on a second terminal of the cascode transistor, the cascode transistor having a control terminal, a first terminal, and a second terminal, wherein the second terminal of the cascode transistor is coupled to the first terminal of the first transistor, receiving a time varying power supply voltage from a modulated power supply on a terminal of a bias circuit, the bias circuit comprising a first resistor having a first terminal coupled to the modulated power supply terminal and a second terminal coupled to a first node, a second resistor having a first terminal coupled to the first node and a second terminal coupled to a reference voltage, and a capacitor having a first terminal coupled to the modulated power supply terminal and a second terminal coupled to the first node, wherein the first node is coupled to the control terminal of the cascode transistor, coupling the time varying power supply voltage to the control terminal of the cascode transistor, and generating an impedance in an inductor having a first terminal coupled to the first terminal of the cascode transistor and a second terminal coupled to a modulated power supply terminal to isolate the first terminal of the cascode transistor from the time varying power supply voltage.

In one embodiment, the first resistor, the second resistor, and the capacitor are configured to couple the time varying power supply signal to the control terminal of the cascode device across a first range of frequencies greater than a second range of frequencies of the input signal.

In one embodiment, the bias circuit is a first bias circuit and the cascode transistor is a first cascode transistor, the method further comprising receiving the time varying power supply voltage from the modulated power supply on a terminal of a second bias circuit, the second bias circuit comprising a third resistor having a first terminal coupled to the modulated power supply terminal and a second terminal coupled to a second node, a fourth resistor having a first terminal coupled to the second node and a second terminal coupled to the reference voltage, and a second capacitor having a first terminal coupled to the modulated power supply terminal and a second terminal coupled to the second node, wherein the second node is coupled to the control terminal of the second cascode transistor, and coupling the time varying power supply voltage to the control terminal of the second cascode transistor.

In one embodiment, the method further comprises coupling the time varying power supply voltage through a third resistor coupled between the first node and the control terminal of the cascode transistor.

In another embodiment, the present disclosure includes an amplifier circuit comprising a first transistor having a control terminal, a first terminal, and a second terminal, the control terminal configured to receive an input signal, a cascode transistor having a control terminal, a first terminal, and a second terminal, wherein the second terminal is coupled to the first terminal of the first transistor, an inductor having a first terminal coupled to the first terminal of the cascode transistor and a second terminal coupled to receive a modulated power supply terminal, and means for coupling a maximum frequency of a time varying power supply signal corresponding to the input signal from the modulated power supply terminal to the control terminal of the cascode transistor to bias the cascode transistor.

In one embodiment, the means for coupling a maximum frequency of the time varying power supply signal comprising a first resistor having a first terminal coupled to the modulated power supply terminal and a second terminal coupled to a control terminal of the cascode transistor, a second resistor having a first terminal coupled to the control terminal of the cascode transistor and a second terminal coupled to a reference voltage, a capacitor having a first terminal coupled to the modulated power supply terminal and a second terminal coupled to the control terminal of the cascode transistor, and a capacitance coupled to the control terminal of the cascode transistor.

In one embodiment, the means for coupling a maximum frequency of the time varying power supply signal comprising a first resistor having a first terminal coupled to the modulated power supply terminal and a second terminal coupled to a first node, a second resistor having a first terminal coupled to the first node and a second terminal coupled to a reference voltage, a capacitor having a first terminal coupled to the modulated power supply terminal and a second terminal coupled to the first node, a third resistor coupled between the first node and control terminal of the cascode transistor, and a capacitance coupled to the control terminal of the cascode transistor.

The following detailed description and accompanying drawings provide a better understanding of the nature and advantages of the present disclosure.

DETAILED DESCRIPTION

The present disclosure pertains to wideband bias circuits. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Some embodiments of the present disclosure may pertain to envelope tracking applications. In an envelope tracking application, a power supply voltage Vdd may be varied over time to reduce the power consumption of a circuit. The time varying power supply voltage may correspond to an input signal so that the input signal may be processed using less power. One example system using envelope tracking (ET) is a power amplifier in a wireless system (e.g., a power amplifier in a transmission path that drives signals to an antenna).

In some ET applications, the bandwidth of the envelope signal may be considerably higher than the bandwidth of the signal being processed. For example, a power amplifier supply voltage (VDD_ET) may be modulated at envelope frequencies that can extend up to 5-10 times the bandwidth of a signal being transmitted. In the long term evolution wireless protocol (LTE) at 20 MHz, for instance, the bandwidth of the power supply may extend up to 200 MHz.

Figure 1:
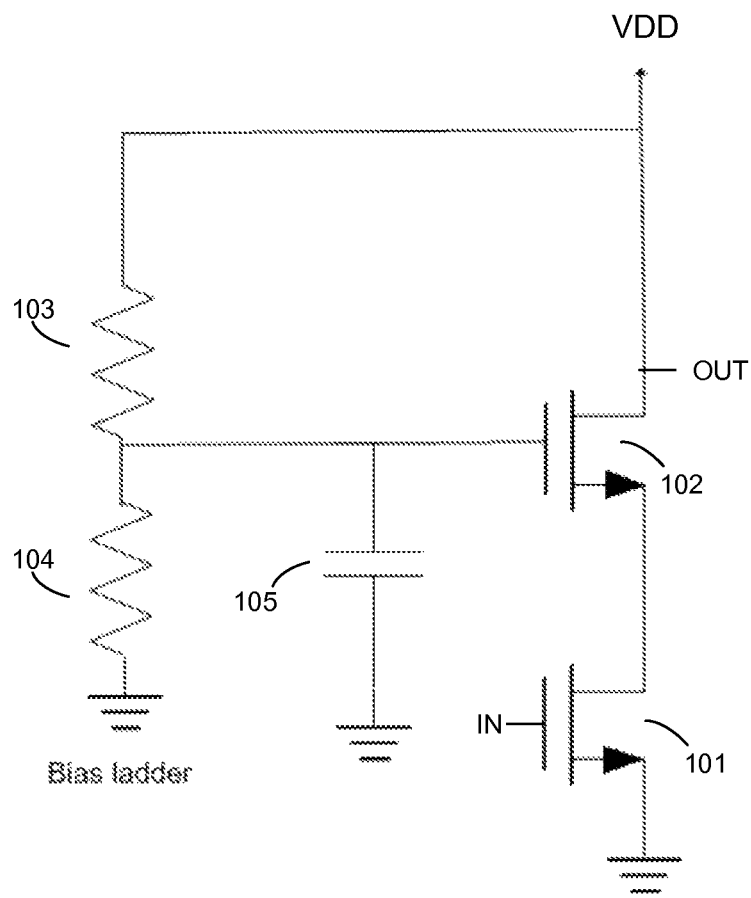
FIG. 1 illustrates a traditional bias circuit including resistive and capacitive elements.

The combination of the bias resistors and the gate capacitance of prior art bias circuits as shown in FIG. 1 produce a low pass frequency response. For common values of gate capacitance, resistors would need to be very small (in the few hundred ohms range) to achieve the desired bandwidth resulting in a very significant power amplifier efficiency (PAE) degradation (around 3-5% for typical Universal Mobile Telecommunications System (UMTS) maximum power conditions).

Figure 2A:
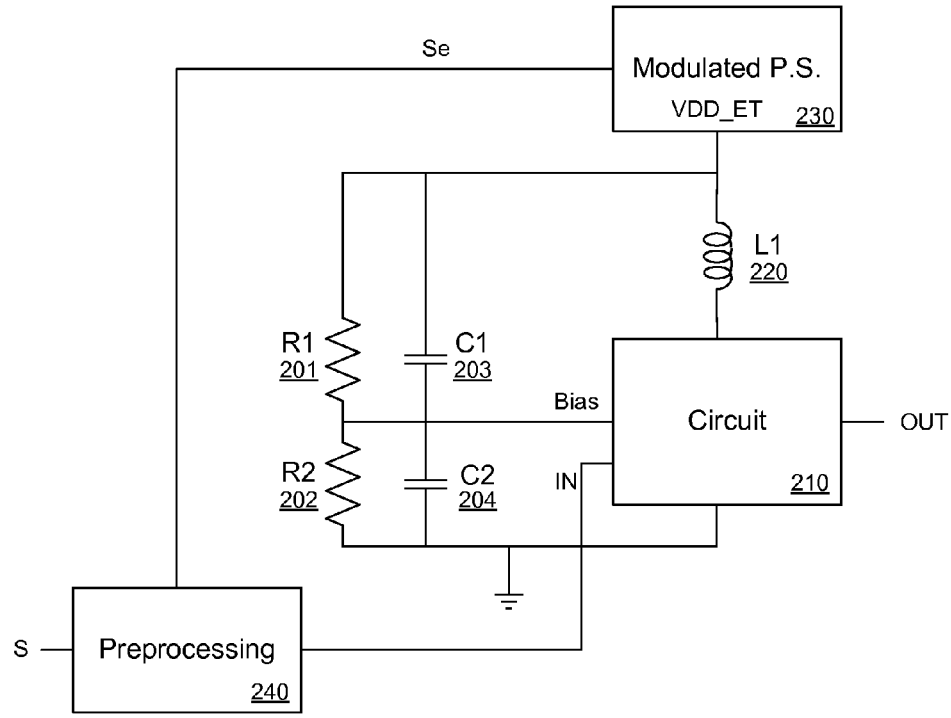
FIG. 2A illustrates an example wideband bias circuit according to one embodiment.

FIG. 2A illustrates an example wideband bias circuit according to one embodiment. In this example, a circuit 210 may receive an input signal (IN) and produce an output signal (OUT). Output signal (OUT) may be an RF single coupled to an antenna (not shown) for transmission over the airwaves, for example. Circuit 210 may include one or more internal nodes that are biased to particular values. In this example, circuit 210 may receive a power supply voltage VDD_ET that may vary over time from a modulated power supply 230. For example, in some applications a preprocessing block 240 may receive a signal to be transmitted, S, and produce input signal IN and modulation control signal Se to control envelop tracking, for example. For instance, circuit 210 may perform envelope tracking (ET) using a time varying power supply VDD_ET. Features and advantages of the present disclosure include a wideband bias circuit that may generate a bias for a circuit node that varies with VDD. The output OUT may be isolated from the power supply signal using an inductor L1 220, for example, which may also isolate the bias circuit from the output signal. The circuit node may provide a bias voltage to a circuit in the signal path of the input signal, and accordingly may be biased using the time varying power supply voltage to reduce power consumption, for example. In this example, a capacitor (C1) 203 is added in parallel with the top resistor (R1) 201 of the resistor ladder to perform a zero-pole cancellation with the existing pole established by the bottom resistor ladder resistor (R2) 202 and a capacitance (C2) 204 resulting in a significant bandwidth extension. Capacitance C2 204 may be the total capacitance at the transistor bias node, for example, and may include intrinsic device capacitance, any further capacitance added to the node (e.g., MIM or MOS capacitances) as well as parasitic capacitances. The addition of capacitor C1 allows use of significantly larger values of resistors R1 and R2, which may result in a higher PAE, for example. C1 may be added to the bias circuit, and by setting the values of the resistors and capacitors as follows, the following transfer function may be achieved between VDD_ET and the bias node:

$V\text{bias}/V\text{dd\_et}=R2/(R1+R2)$; where $jwRC$ for $R1C1$ and $R2C2$ cancel.

Accordingly, a time varying power supply voltage (e.g., an envelope signal) may be coupled to a bias node of a circuit to bias the node without unduly eliminating high frequencies from the power supply signal, for example. In one embodiment, one or more of the capacitances or resistances may be programmable. Adding programming and tuning may allow independent control of the circuit bandwidth and bias voltage, for example.

Figure 2B:
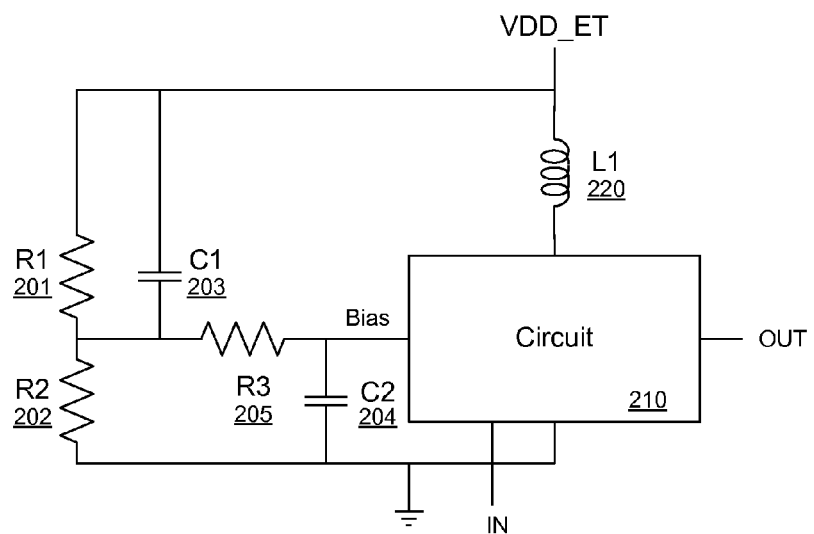
FIG. 2B illustrates an example wideband bias circuit according to another embodiment.

FIG. 2B illustrates an example wideband bias circuit according to another embodiment. In this example, a resistor (R3) 205 is configured between terminals of R1, R2, and C1 and the bias node including parasitic node capacitance C2. This example configuration may reduce loading at particular frequencies (e.g., RF frequencies), but may limit the high frequency bandwidth of the circuit. The following transfer function may be achieved between VDD_ET and the bias node using the configuration shown in FIG. 2B:

$V\text{bias}/V\text{dd\_et}=R2/(R1+R2(1+jwC2R3))$; where $R1C1=R2C2$ and $R2>>R3$.

Figure 3A:
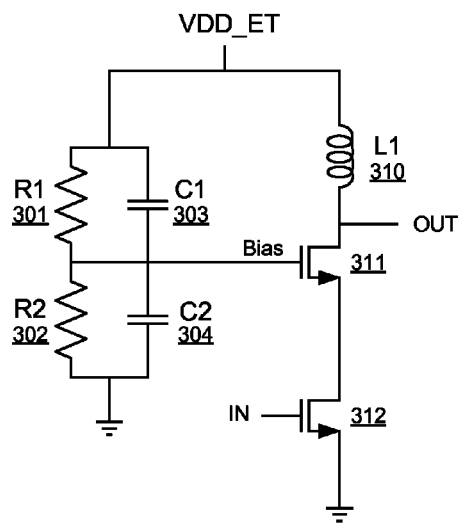
FIG. 3A illustrates an example wideband bias circuit in an amplifier circuit according to one embodiment.
Figure 3B:
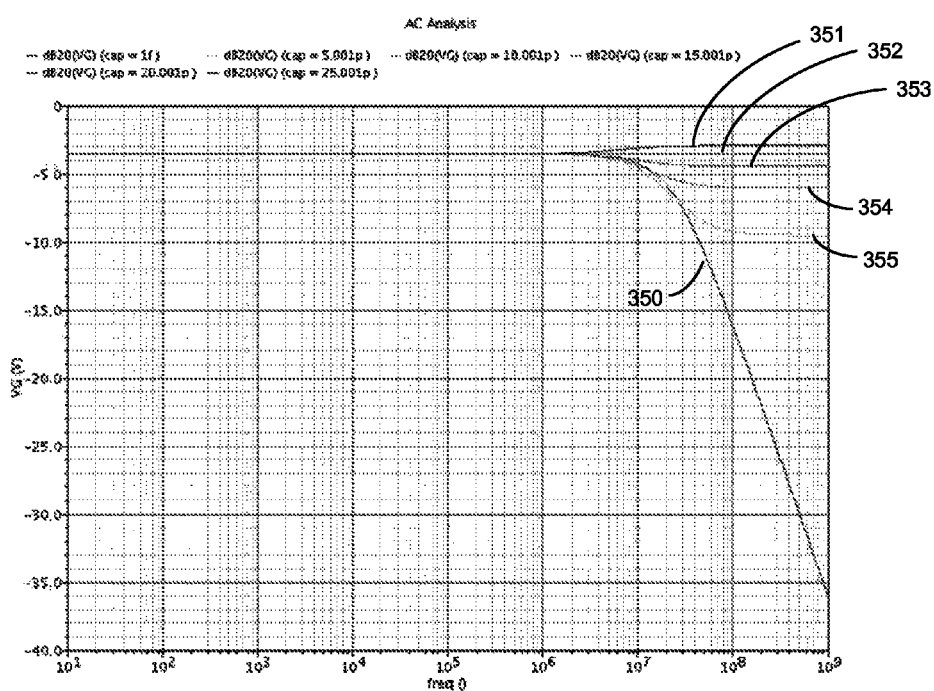
FIG. 3B illustrates frequency response of the example wideband bias circuit in FIG. 3A.

FIG. 3A illustrates an example wideband bias circuit in an amplifier circuit according to one embodiment. This example illustrates the application of a wideband bias circuit to generate a bias voltage on the gate of a cascode transistor 311 in an amplifier circuit. In this example, an input signal (IN) is received on the gate of NMOS transistor 312. Transistor 312 has a drain coupled to the source of transistor 311. A drain of transistor 311 is coupled to a time varying power supply voltage VDD_ET through an inductor (L1) 310. An output signal (OUT) is produced on the drain of transistor 311 and a terminal of inductor L1. VDD_ET may implement envelope tracking, for example. The modulated power supply voltage is converted to an appropriate bias voltage at the gate of transistor 311 by wideband bias circuit including resistor (R1) 301, resistor (R2) 302, capacitor (C1) 303, and gate capacitance (C2) 304. Inductor 310 may isolate the output at the drain of transistor 311 from the power supply signal and isolate the bias circuit from the output signal, for example. FIG. 3B illustrates frequency response of the example wideband bias circuit in FIG. 3A. Response 350 illustrates that the response without capacitor C1 drops at high frequencies. Responses 351-355 illustrate that the responses for different values of C1 stay approximately flat at higher frequencies and do not drop off.

Figure 4:
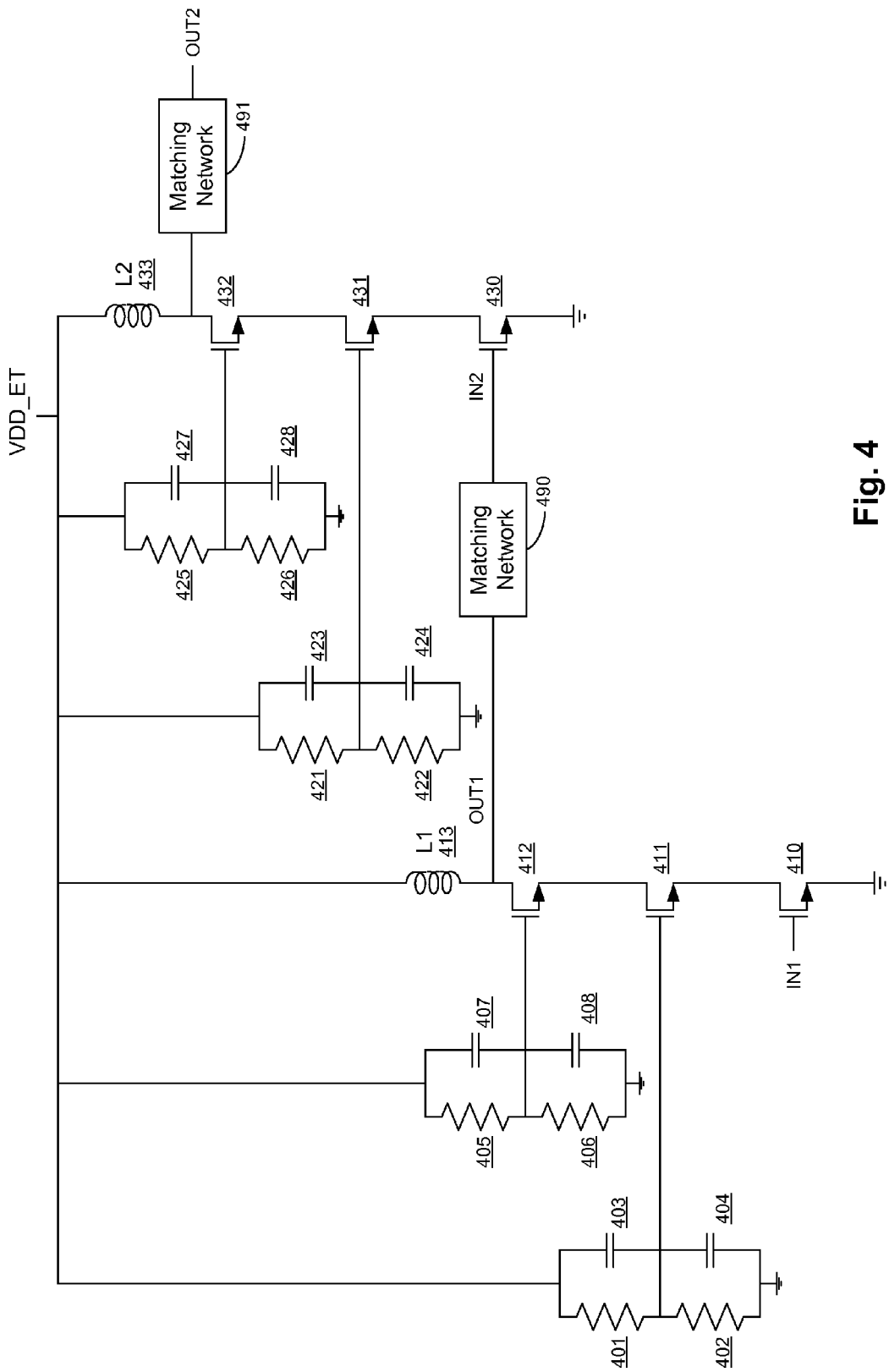
FIG. 4 illustrates another example of wideband bias circuits according to another embodiment.

FIG. 4 illustrates another example of wideband bias circuits according to another embodiment. This example illustrates a driver amplifier and a power amplifier including wideband bias circuits according to one embodiment. The driver amplifier includes NMOS transistors 410-412 arranged in a cascode configuration and coupled to a power supply through inductor L1 413. An input signal (IN1) is received on the gate of transistor 410 and a time varying power supply voltage, VDD-ET, corresponding to the input signal is received at the power supply terminal. A first wideband bias circuit comprising resistors 401-402 and capacitors 403-404 generates a bias voltage on the gate of transistor 411, where capacitance 404 includes a gate capacitance of transistor 411 (e.g., device capacitance, additional added capacitance, and parasitic capacitance). A second wideband bias circuit comprising resistors 405-406 and capacitors 407-408 generates a bias voltage on the gate of transistor 412, where capacitance 408 also includes to a gate capacitance of transistor 412. The output signal of the driver circuit (OUT1) is from a node between L1 and the drain of transistor 412. OUT1 is provided to an input of the power amplifier through a matching network 490, for example.

Similarly, the power amplifier includes NMOS transistors 430-432 arranged in a cascode configuration and coupled to a power supply through inductor L2 433. An input signal (IN2) is received on the gate of transistor 430 from matching network 490 and a time varying power supply voltage, VDD-ET, corresponding to the input signal is received at the power supply terminal. A third wideband bias circuit comprising resistors 421-422 and capacitors 423-424 generates a bias voltage on the gate of transistor 431, where capacitance 424 includes to a gate capacitance of transistor 431 (e.g., device capacitance, additional added capacitance, and parasitic capacitance). A fourth wideband bias circuit comprising resistors 425-426 and capacitors 427-428 generates a bias voltage on the gate of transistor 432, where capacitance 428 also includes to a gate capacitance of transistor 432. The output signal of the power amplifier is from a node between L2 and the drain of transistor 432. The output signal is provided to an antenna, for example, through a matching network 491 (OUT2).

Figure 5:
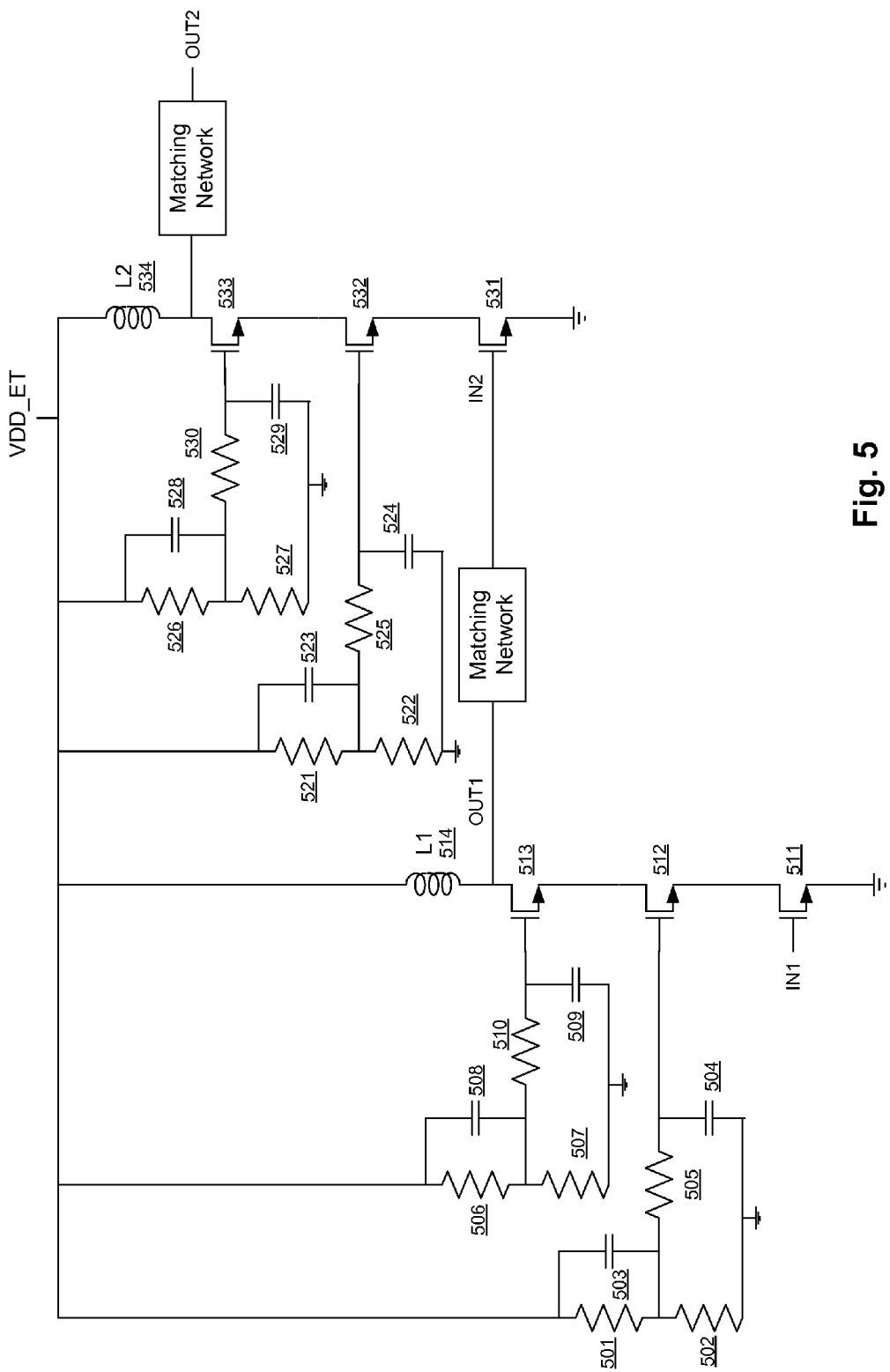
FIG. 5 illustrates another example of wideband bias circuits according to another embodiment.

FIG. 5 illustrates another example of wideband bias circuits according to another embodiment. This example is the same as shown in FIG. 4, except each wideband bias circuit includes a resistor between the gate capacitance of each cascode transistor and the other elements of the wideband bias circuit.

Figure 6:
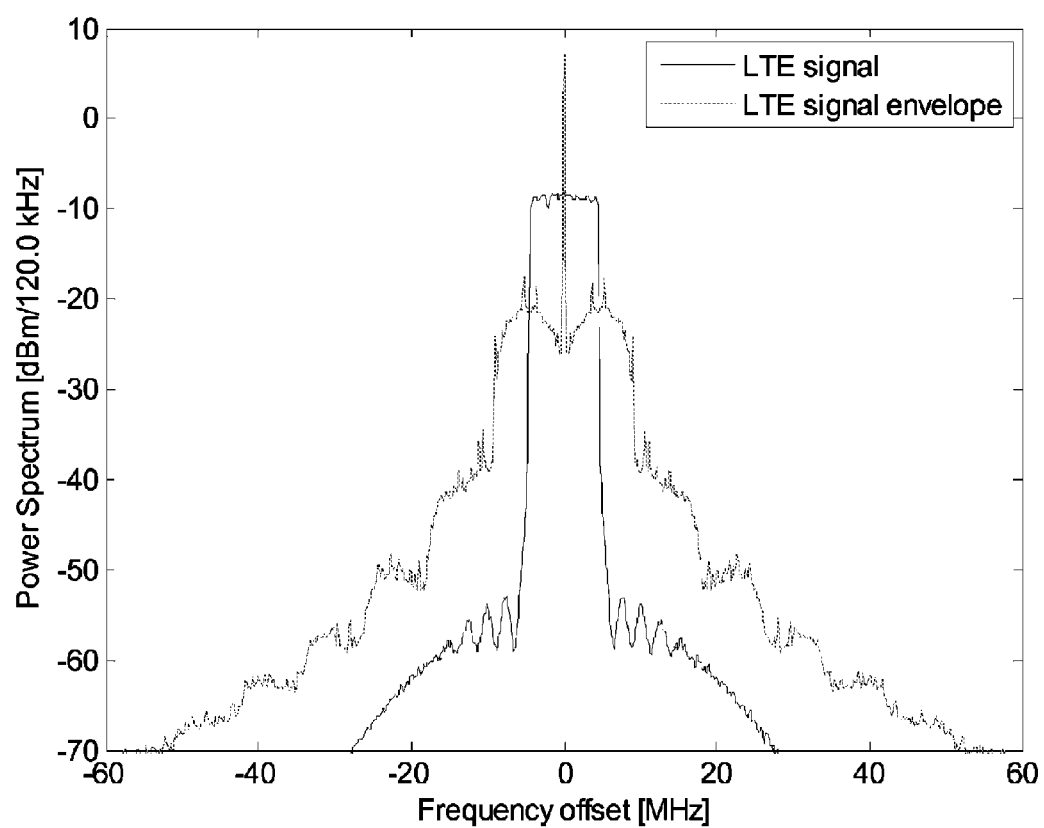
FIG. 6 illustrates an example spectrum of an envelope and input signal according to one embodiment.
Figure 7A:
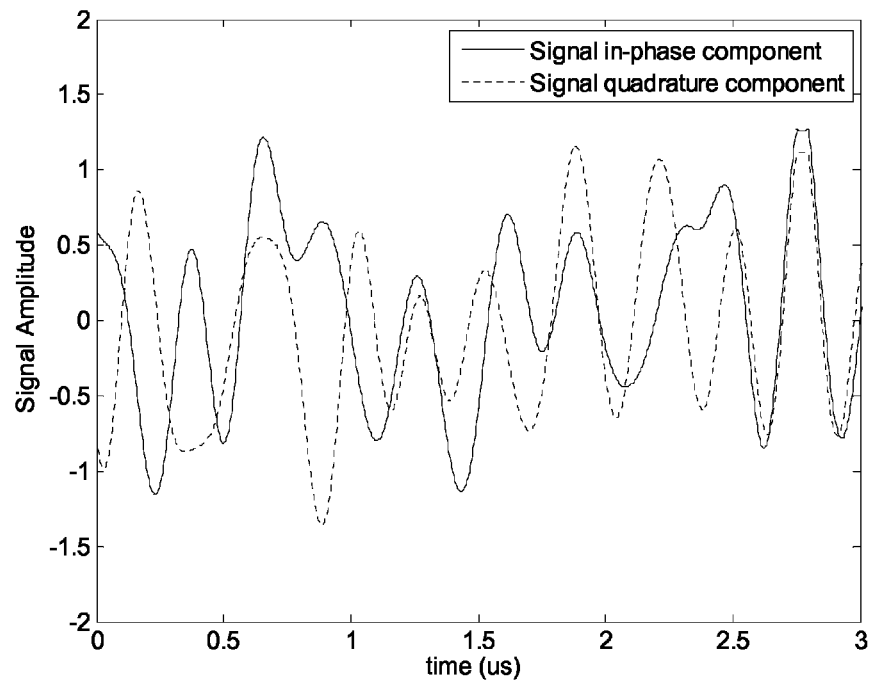
FIG. 7A illustrates an example signal according to one embodiment.
Figure 7B:
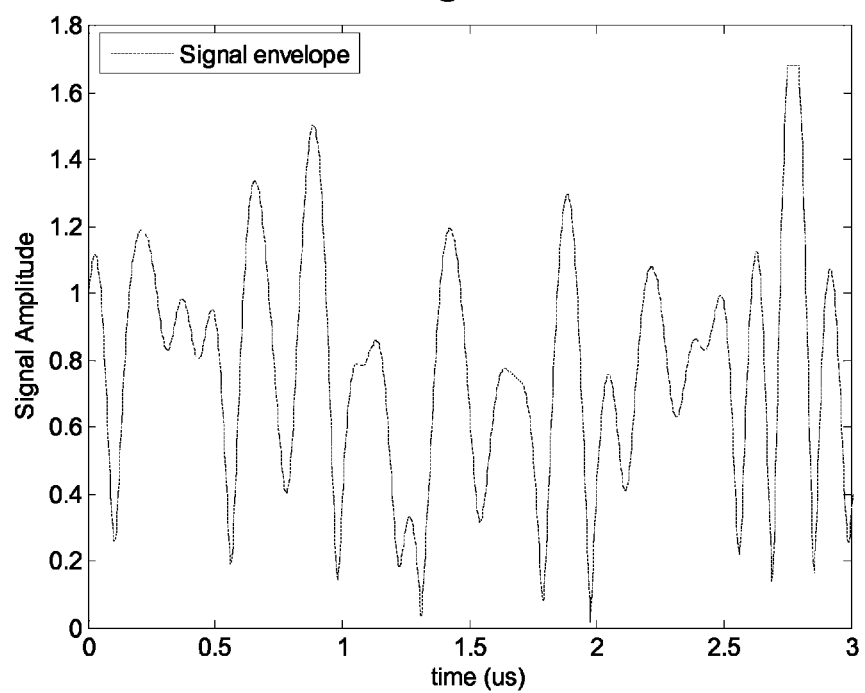
FIG. 7B illustrates an example envelope according to one embodiment.

FIG. 6 illustrates an example spectrum of an envelope and input signal according to one embodiment. This example illustrates that the frequency range of the time varying power supply voltage may be greater than the frequency range of the input signal being amplified, for example. The example shown in FIG. 6 illustrates an LTE signal and an LTE envelope. FIG. 7A illustrates an example signal according to one embodiment. FIG. 7A shows both the in-phase and quadrature components of an input signal. FIG. 7B illustrates an example envelope according to one embodiment. FIG. 7B shows a signal envelope for the input signal in FIG. 7A.

The above description illustrates various embodiments of the present disclosure along with examples of how aspects of the particular embodiments may be implemented. For example, while the above examples are described in terms of NMOS transistors, other transistor types could also be used. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An amplifier circuit comprising:
   a first transistor having a control terminal, a first terminal, and a second terminal, the control terminal configured to receive an input signal;
   a cascode transistor having a first terminal, a control terminal coupled to a first node, and a second terminal coupled to the first terminal of the first transistor;
   an inductor having a first terminal coupled to the first terminal of the cascode transistor and a second terminal coupled to a modulated power supply terminal configured to produce a time varying power supply voltage corresponding to the input signal;
   a first resistor having a first terminal coupled to the second terminal of the inductor and the modulated power supply terminal, the first resistor having a second terminal coupled to the first node;
   a second resistor having a first terminal coupled to the first node and a second terminal coupled to a reference voltage; and
   a capacitor having a first terminal coupled to the second terminal of the inductor and the modulated power supply terminal, the capacitor having a second terminal coupled to the first node.

2. The circuit of claim 1 wherein the control terminal of the cascode transistor comprises a capacitance.

3. The circuit of claim 2 wherein the first resistor, the second resistor, and the capacitor are configured to couple the time varying power supply voltage to the control terminal of the cascode device across a first range of frequencies greater than a second range of frequencies of the input signal.

4. The circuit of claim 1 wherein a first product of a resistance of the first resistor and a capacitance of the capacitor is approximately equal to a second product of a resistance of the second resistor and a capacitance at the control terminal of the cascode transistor.

5. The circuit of claim 1 wherein the amplifier circuit is a power amplifier circuit having an output coupled to an antenna, and wherein the time varying power supply voltage is an envelope signal.

6. The circuit of claim 1 wherein the inductor isolates the first terminal of the cascode transistor from the time varying power supply voltage on the second terminal of the inductor.

7. The circuit of claim 1 wherein a bandwidth of the input signal is less than a bandwidth of the time varying power supply voltage.

8. The circuit of claim 1 wherein at least one of the first resistor, the second resistor, and the capacitor are programmable.

9. An amplifier circuit comprising:
   a first transistor having a control terminal, a first terminal, and a second terminal, the control terminal configured to receive an input signal;
   a cascode transistor having a control terminal, a first terminal, and a second terminal, wherein the second terminal is coupled to the first terminal of the first transistor;
   an inductor having a first terminal coupled to the first terminal of the cascode transistor and a second terminal coupled to a modulated power supply terminal; and
   a resistor ladder comprising a first resistor and a second resistor, the resistor ladder coupling a time varying power supply voltage corresponding to the input signal from the modulated power supply terminal and the second terminal of the inductor to the control terminal of the cascode transistor to bias the cascode transistor;
   a zero-pole cancellation circuit comprising a capacitor in parallel with the first resistor, wherein a bandwidth of the input signal is less than a bandwidth of the time varying power supply voltage.

10. The circuit of claim 9, said zero-pole cancellation circuit further comprises:
    the first resistor having a first terminal coupled to the modulated power supply terminal and a second terminal coupled to a control terminal of the cascode transistor;
    the second resistor having a first terminal coupled to the control terminal of the cascode transistor and a second terminal coupled to a reference voltage;
    the capacitor having a first terminal coupled to the modulated power supply terminal and a second terminal coupled to the control terminal of the cascode transistor; and
    a first capacitance coupled to the control terminal of the cascode transistor,
    wherein a first product of a resistance of the first resistor and a capacitance of the capacitor is approximately equal to a second product of a resistance of the second resistor and the first capacitance.

11. An amplifier circuit comprising:
    a first transistor having a control terminal, a first terminal, and a second terminal, the control terminal configured to receive a first input signal;
    a first cascode transistor having a control terminal, a first terminal, and a second terminal, wherein the second terminal of the first cascode transistor is coupled to the first terminal of the first transistor;
    a second cascode transistor having a control terminal, a first terminal, and a second terminal, wherein the second terminal of the second cascode transistor is coupled to the first terminal of the first cascode transistor;
    a first inductor having a first terminal coupled to the first terminal of the second cascode transistor and a second terminal coupled to a terminal of a modulated power supply, the modulated power supply producing a time varying power supply voltage corresponding to the first input signal;

a first resistor having a first terminal coupled to the second terminal of the first inductor and the modulated power supply terminal, the first resistor having a second terminal coupled to a first node;

a second resistor having a first terminal coupled to the first node and a second terminal coupled to a reference voltage;

a first capacitor having a first terminal coupled to the second terminal of the inductor and the modulated power supply terminal, the first capacitor having a second terminal coupled to the first node;

a third resistor having a first terminal coupled to the second terminal of the first inductor and the modulated power supply terminal, the third resistor having a second terminal coupled to a second node;

a fourth resistor having a first terminal coupled to the second node and a second terminal coupled to the reference voltage; and a second capacitor having a first terminal coupled to the second terminal of the inductor and the modulated power supply terminal, the second capacitor having a second terminal coupled to the second node, wherein the first node is coupled to the control terminal of the first cascode transistor, and wherein the second node is coupled to the control terminal of the second cascode transistor.

12. The circuit of claim 11 wherein a first product of a resistance of the first resistor and a capacitance of the first capacitor is approximately equal to a second product of a resistance of the second resistor and a capacitance at the control terminal of the first cascode transistor, and wherein a third product of a resistance of the third resistor and a capacitance of the second capacitor is approximately equal to a second product of a resistance of the fourth resistor and a capacitance at the control terminal of the second cascode transistor.

13. The circuit of claim 11 further comprising:

a second transistor having a control terminal, a first terminal, and a second terminal, the control terminal configured to receive a second input signal;

a third cascode transistor having a control terminal, a first terminal, and a second terminal, wherein the second terminal of the third cascode transistor is coupled to the first terminal of the second transistor;

a fourth cascode transistor having a control terminal, a first terminal, and a second terminal, wherein the second terminal of the fourth cascode transistor is coupled to the first terminal of the third cascode transistor, and wherein the first terminal of the fourth cascode transistor is coupled to the control terminal of the first transistor and wherein the first input signal is an amplified version of the second input signal;

a second inductor having a first terminal coupled to the first terminal of the fourth cascode transistor and a second terminal coupled to the modulated power supply terminal;

a fifth resistor having a first terminal coupled to the second terminal of the second inductor and the modulated power supply terminal, the fifth resistor having a second terminal coupled to a third node;

a sixth resistor having a first terminal coupled to the third node and a second terminal coupled to the reference voltage;

a third capacitor having a first terminal coupled to the second terminal of the second inductor and the modulated power supply terminal, the third capacitor having a second terminal coupled to the third node;

a seventh resistor having a first terminal coupled to the second terminal of the second inductor and the modulated power supply terminal, the seventh resistor having a second terminal coupled to a fourth node;

a eighth resistor having a first terminal coupled to the fourth node and a second terminal coupled to the reference voltage; and a fourth capacitor having a first terminal coupled to the second terminal of the second inductor and the modulated power supply terminal, the fourth capacitor having a second terminal coupled to the fourth node, wherein the third node is coupled to the control terminal of the third cascode transistor, and wherein the fourth node is coupled to the control terminal of the fourth cascode transistor.

* * * * *